United States Patent
Nibarger et al.

(10) Patent No.: US 7,495,871 B1
(45) Date of Patent: Feb. 24, 2009

(54) TOP FORMED GRATING STABILIZER

(75) Inventors: John P. Nibarger, Superior, CO (US); Edward V. Denison, Erie, CO (US); Carl Anthony Helms, Lafayette, CO (US); Carl Stephen Arnold, Golden, CO (US)

(73) Assignee: Storage Technology Corporation, Louisville, CO (US)

( * ) Notice: Subject to any disclaimer, the term of this patent is extended or adjusted under 35 U.S.C. 154(b) by 661 days.

(21) Appl. No.: 11/190,040

(22) Filed: Jul. 26, 2005

(51) Int. Cl.
*G11B 5/127* (2006.01)
(52) U.S. Cl. .................................. 360/327.3
(58) Field of Classification Search ............. 360/324.1, 360/324.11, 327.3, 324.2; 29/603.14
See application file for complete search history.

(56) References Cited

U.S. PATENT DOCUMENTS

| | | | | |
|---|---|---|---|---|
| 5,592,082 | A * | 1/1997 | Kuriyama | 324/252 |
| 6,597,547 | B1 * | 7/2003 | Kawawake et al. | 360/324.11 |
| 6,754,048 | B2 * | 6/2004 | Li et al. | 360/315 |
| 7,118,814 | B1 * | 10/2006 | Arnold et al. | 428/811.5 |
| 7,312,958 | B2 * | 12/2007 | Aono | 360/324.11 |
| 2001/0027603 | A1 * | 10/2001 | Komuro et al. | 29/603.14 |
| 2002/0012209 | A1 * | 1/2002 | Ajiki et al. | 360/327.3 |
| 2003/0156360 | A1 * | 8/2003 | Kawawake et al. | 360/324.11 |
| 2004/0042133 | A1 * | 3/2004 | Parker | 360/327.3 |
| 2008/0068763 | A1 * | 3/2008 | Aono | 360/324.1 |

OTHER PUBLICATIONS

Asada et al, "Micromagnetic Study of Domain Wall Pinning Characteristics with Grooves in Thin Films", pp. 1-3.
Da Silva et al., "Zigzag-shaped Magnetic Sensors", Applied Physics Letters, vol. 85, No. 24, Dec. 2004, pp. 6022-6024.
U.S. Appl. No. 10/224,011, He et al., Magnetic Recording Head Having Modules with Opposing Read Elements and Opposing Period Structures, Aug. 20, 2002.
U.S. Appl. No. 10/791,257, Arnold et al., Apparatus and Method for Step-Stabilization of GMR-Based Read Sensors, Mar. 2, 2004.
U.S. Appl. No. 10/862,287, Arnold et al., Discrete Step Stabilization of Narrow-Track AMR Read Sensors, Jun. 7, 2004.

* cited by examiner

*Primary Examiner*—Allen T Cao
(74) *Attorney, Agent, or Firm*—Brooks Kushman P.C.

(57) ABSTRACT

A magneto-resistive sensor head and a method of manufacturing the magneto-resistive sensor head. The magneto-resistive sensor head includes a first lead and a second lead. A magneto-resistive layer and a biasing layer are disposed between the first lead and the second lead. A grating is disposed in the magneto-resistive layer. The topography of the biasing layer is unaffected by the presence of the grating.

15 Claims, 2 Drawing Sheets

TOP FORMED GRATING STABILIZER

BACKGROUND OF THE INVENTION

1. Field of the Invention

The present invention relates generally to magnetic sensors and particularly to magneto-resistive sensors.

2. Description of the Related Art

Magnetic storage media, such as magnetic storage tape systems and hard drives, rely on magnetic sensors to read data contained within the storage media. The magnetic sensor detects variations in a sensed magnetic field as the sensor passes over the media. The variations in the magnetic field may be used to read the data contained on the storage media.

One type of magnetic sensor used to read magnetic storage media is anisotropic magneto-resistive (AMR) sensors. Control of response characteristics for AMR sensors is an important design consideration for current and future magnetic tape heads. One method of controlling response characteristics involves the use of a periodic structure formed into the substrate on which the sensor stack is deposited. This periodic structure is commonly referred to as a grating.

The effect of the grating is to impart a short-range or localized magnetic field which acts on the magnetization of the sensor in such a way that the magnetization preferentially is directed parallel to the grating direction. This assists in the proper biasing of the AMR sensor magnetization which is close to 45 degrees. One problem with this design is that the edge definition and wall angles of the grating structure are lessened with each subsequent layer deposition in the magneto-resistive sensor. In addition, the grating is only created in the bottom regions of the AMR sensor structure, so avoiding this problem using current techniques is difficult, if not impossible. Therefore, it would be advantageous to have an improved method and apparatus for allowing an AMR sensor to have more layers deposited on the sensor, but without changing the topography in of the bottom region of the magneto-resistive sensor.

SUMMARY OF THE INVENTION

The present invention provides a magneto-resistive sensor head and a method of manufacturing the magneto-resistive sensor head. The magneto-resistive sensor head includes a first magnet or first lead and a second magnet or second lead. A magneto-resistive layer is disposed between the first magnet and the second magnet in a coplanar structure. A grating is disposed in the magneto-resistive layer. The topography of preceding layers, if present, are unaffected by the presence of the grating.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
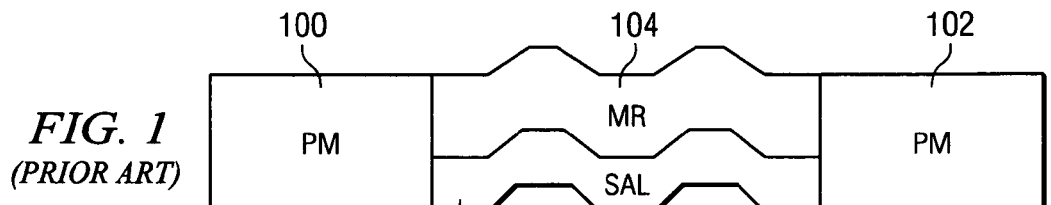
FIG. 1 shows a cross section of a current AMR sensor head.

With reference now to the figures and in particular with reference to FIG. 1, FIG. 1 shows a cross section of a current anisotropic magneto-resistive (AMR) sensor head. Leads 100 and 102 are attached to either side of a magneto-resistive layer 104 and a biasing layer 106, such as a soft adjacent layer. Leads 100 and 102 may be permanent magnets, conductive materials, or may be other types of magnets. Leads 100 and 102 may also be disposed near magneto-resistive layer 104 and biasing layer 106. Magneto-resistive layer 104 may be made from a number of materials, including various stochiometries of Nickel-Iron and Nickel-Cobalt alloys. Magneto-resistive layer 104 may also be formed from a number of sub-layers disposed on a substrate. Biasing layer 106 may be formed from materials such as CoZrMo, NiFeRh, NiFeCr, and NiFe, and may be other kinds of materials depending on the nature of the biasing layer. Leads 100 and 102 may be formed from materials such as Cobalt-Platinum-Chrome alloys, and/or may be made from a variety of conductive materials.

Magneto-resistive layer 104 serves as a magneto-resistive sensor whose resistivity changes in response to changes in its magnetization, which in turn changes in response to sensed magnetic fields in a recording medium such as tape or disk media. Biasing layer 106 is used to create a vertical axis, or top-bottom axis, biasing magnetic field that is applied to the magneto-resistive layer 104. Leads 100 and 102 are used to create horizontal axis, or left-right, axis biasing magnetic fields that are applied to the magneto-resistive layer 104 and to direct current through it. Both types of biasing magnetic fields serve to create magneto-resistive layer 104 magnetization response behavior that is optimal for detecting the sensed magnetic fields in a recording medium.

A grating is disposed in magneto-resistive layer 104. The grating is used to impart a short-range magnetic field that directs the sensor magnetization parallel to the grating in order to bias the sensor in an optimal fashion. The short-range magnetic field increases the performance and stability of the sensor. The grating is typically created at a 45-degree angle relative to the long axis of the magneto-resistive sensor head.

The grating shown in FIG. 1 can be formed in the bottom of the magneto-resistive head. Forming of the grating can be accomplished by numerous methods such as milling, plasma etch, reactive gas etch, or selective ion etch. The bottom surface of the head is defined in part by a surface of the biasing layer, or by whatever additional layer is disposed opposite the magneto-resistive layer and furthest from the magneto-resistive layer. Thus, as the bottom of the magneto-resistive head is formed, both the biasing layer topology and the magneto-resistive topology are changed. The outwardly facing surface of the magneto-resistive layer forms a portion of the top of the magneto-resistive sensor head. For this reason, both the top and bottom surfaces of the magneto-resistive sensor head have periodic ridges to define the grating structure.

In use, the magneto-resistive sensor head is passed over an object to be sensed. Fluctuations in the magnetic field on or near the object are detected by the magneto-resistive sensor head and in particular by the magneto-resistive layer. For example, the magneto-resistive sensor head shown in FIG. 1 may be passed over a tape of a tape data storage system. The tape has a magnetic field that has been manipulated such that changes in the magnetic field may be detected by the magneto-resistive sensor head. These magnetic field changes are converted into usable data, which may take the form of digital or analog signals.

Figure 2:
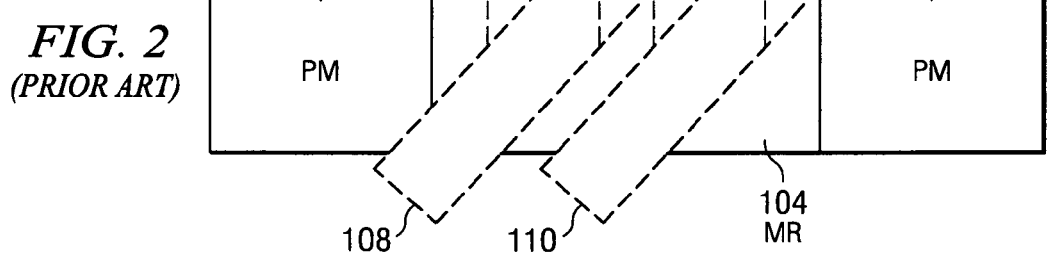
FIG. 2 shows a current AMR sensor head as seen from above.

FIG. 2 shows a current AMR sensor head as seen from above. Reference numerals in FIG. 2 correspond to like reference numerals in FIG. 1 to show that the same magneto-resistive sensor head is shown from two different perspectives. Thus, leads 100 and 102, as well as magneto-resistive layer 104 and biasing layer 106 in FIG. 2 correspond to similar features shown in FIG. 1. Phantom lines 112 show that the ridges in the magneto-resistive layer, which are also present in the biasing layer, correspond to ridges 108 and 110 that form the grating on the top surface of the magneto-resistive layer. When viewing the magneto-resistive layer from above, the axis of the grating is canted at an angle of approximately 45 degrees. This canting assists in stabilizing the element and creating proper bias in the element.

The magneto-resistive sensor head shown in FIG. 1 and FIG. 2 is bottom-formed because the forming process used to create the grating is performed from the bottom of the magneto-resistive sensor head. For a bottom-formed magneto-resistive sensor head, such as the one shown in FIG. 1 and FIG. 2, none of the films or layers that form either the magneto-resistive sensor layer or the biasing layer are materially thinned or have intentional thickness variation within each individual layer. In the past, this process was favored because processing complexity is increased if the films or layers have intentional thickness variations.

However, the bottom-formed magneto-resistive sensor head shown in FIG. 1 and FIG. 2 has certain disadvantages, as described above. For example, the ability to create a high degree of edge definition and steep grating wall angles is limited with each subsequent sub-layer added to magneto-resistive layer 104. Hence, the biasing effect of the grating of the magneto-resistive sensor head shown in FIG. 1 and FIG. 2 is limited vis-à-vis magneto-resistive sensor heads formed from fewer sub-layers.

Figure 3:
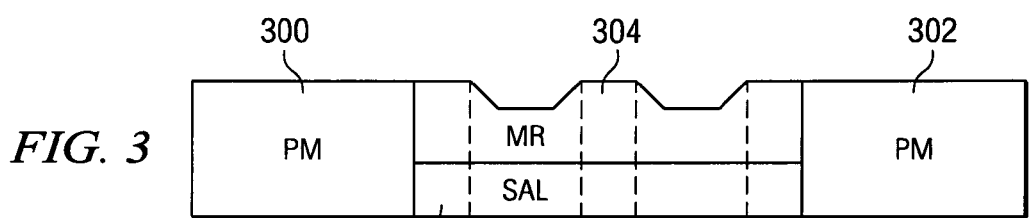
FIG. 3 shows a cross section of a top-formed AMR sensor head, in accordance with an illustrative embodiment of the present invention.
Figure 4:
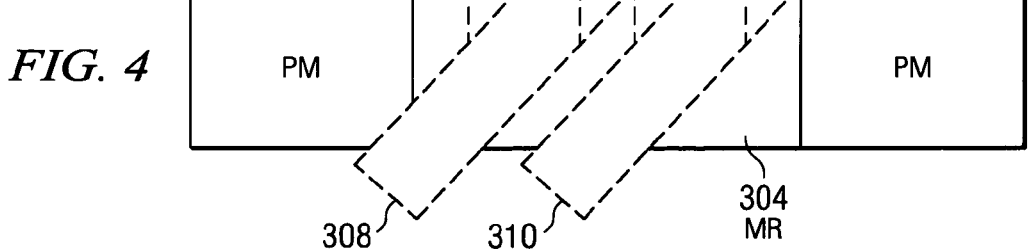
FIG. 4 shows a top-formed AMR sensor head as seen from above, in accordance with an illustrative embodiment of the present invention.

FIG. 3 shows a cross section of a top-formed AMR sensor head, in accordance with an illustrative embodiment of the present invention. FIG. 4 shows a top-formed AMR sensor head as seen from above, in accordance with an illustrative embodiment of the present invention. FIG. 3 and FIG. 4 are considered together in the following description of the top-formed AMR sensor head.

As with the magneto-resistive sensor head shown in FIG. 1 and FIG. 2, leads 300 and 302 are disposed on either side of a magneto-resistive layer 304 and a biasing layer 306, which may be a soft adjacent layer. Leads 300 and 302 may be permanent magnets and/or may be other types of magnets. Leads 300 and 302, as well as magneto-resistive layer 304 and biasing layer 306 may be made from materials and have structures similar to those described with respect to FIG. 1 and FIG. 2. The grating is shown by the indentations shown in FIG. 3. Phantom lines 312 show that the indentations shown in FIG. 3 correspond to indentations 308 and 310 shown in FIG. 4.

Similarly, the bottom surface of the head is defined in part by a surface of the biasing layer, or by whatever additional layer is disposed opposite the magneto-resistive layer and furthest from the magneto-resistive layer. The outwardly facing surface of the magneto-resistive layer forms a portion of the top of the magneto-resistive sensor head.

However, a difference between the magneto-resistive sensor head shown in FIG. 3 and FIG. 4 versus that shown in FIG. 1 and FIG. 2 is that the magneto-resistive sensor head shown in FIG. 3 and FIG. 4 has been formed from the top. A magneto-resistive sensor head that has been formed from the top may be referred to as a top-formed magneto-resistive sensor head. In contrast, the magneto-resistive sensor head in FIG. 1 and FIG. 2 has been formed from the bottom, resulting in topography of the biasing layer or other material deposited beneath the magneto-resistive sensor. This topography transfers into the magneto-resistive sensor, resulting in dulling or washing out of the grating edge.

The top-formed magneto-resistive sensor head shown in FIG. 3 and FIG. 4 has several advantages over the bottom-formed magneto-resistive sensor head shown in FIG. 1 and FIG. 2. For example, the wall angles of the sensor and of the grating in a top-formed magneto-resistive sensor head can be made steeper than those of a comparable bottom-formed magneto-resistive sensor head. The steeper wall angles have the effect of strengthening preferential orientation of the sensor local magnetization parallel to the grating direction, thereby allowing the grating to better bias the magneto-resistive sensor. Another advantage is that the top-forming process allows for better control of the grating edge definition. Again, better edge control allows the sensor magnetization orientation parallel to the grating direction to be strengthened, with corresponding increased bias performance and stability. Yet another advantage is that only the magneto-resistive layer is perturbed by the forming process. Thus, the topology of the biasing layer is unaffected by the forming process or the presence of the grating; similarly, the biasing layer is unperturbed by the process of forming the grating in the magneto-resistive layer. In the bottom-forming process, the perturbations in the biasing layer, as shown in FIG. 1 and FIG. 2, are undesirable because the biasing layer does not operate optimally due to the structure perturbation. The structure perturbation weakens the strength with which the sensor magnetization is oriented parallel to the grating direction. This perturbation inhibits the ability of the biasing layer to saturate fully and properly bias the magneto-resistive sensor.

However, the top-forming process introduces two complexities relative to the bottom-forming process. First, in a bottom-formed magneto-resistive sensor head, none of the films or layers are materially thinned and hence do not have intentional film thickness variation. A top-formed magneto-resistive sensor head, however, benefits from a variation in the thickness of films or layers that form the magneto-resistive layer or the biasing layer. While feasible, the variations may increase the complexity of manufacturing the magneto-resistive sensor head. Second, material etch selectivity and process control is more difficult in the top-forming process-compared to that of the bottom-forming process. These manufacturing aspects are more difficult because magnetic metal alloys in magneto-resistive layer 304 are being removed, in contrast to the bottom-forming process where magnetically inactive non-conductors are being formed to form the grating. Another manufacturing complexity arises from possible damage to the magneto-resistive sensor, creating variations in signal strength. If one creates a grating that is too deep, then the magnetization direction pinning effect is too large. If the magnetization pinning effect is large, then signal strength is decreased. If the grating is too shallow, then the signal increases, but at the expense of proper biasing and stability.

Figure 5:
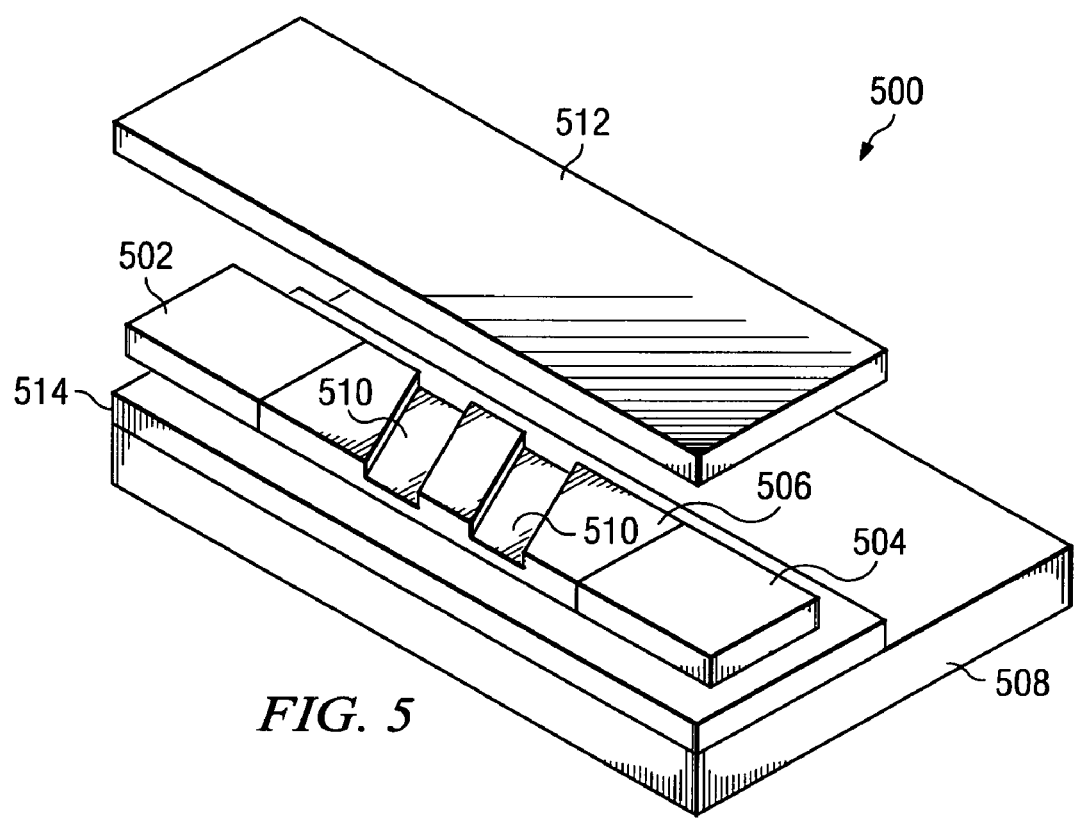
FIG. 5 shows a top-formed AMR sensor head in perspective view, in accordance with an illustrative embodiment of the present invention.

FIG. 5 shows a top-formed AMR sensor head 500 in perspective view, in accordance with an illustrative embodiment of the present invention. As with the magneto-resistive sensor head shown in FIG. 1 through FIG. 4, leads 502 and 504 are disposed on either side of magnetic sensor element 506. Magnetic sensor element 506 which may comprise a magnetic layer and a biasing layer, such as a soft adjacent layer. Magnetic sensor element 506 is disposed on substrate 508. Leads 502 and 504 may be permanent magnets and/or may be other types of magnets. Leads 502 and 504, as well as magnetic sensor element 506, may be made from materials and have structures similar to those described with respect to FIG. 1 through FIG. 4.

Grating 510 is shown by the indentations present in magnetic element 506. Grating 510 is top-formed because grating 510 has been formed from the side of element 506 opposite substrate 508. The side opposite the substrate is referred to the "top" of magnetic sensor element 506. The effect of top-forming magnetic sensor element 506 is described vis-à-vis the magnetic sensors shown in FIG. 3 and FIG. 4.

Optional, shields 512 and 514 may be provided on either side of magnetic sensor element 506. Shield 514 is disposed between magnetic sensor element 506 and substrate 508. Shield 512 is disposed opposite shield 514, on "top" of magnetic sensor element 506. Shields 512 and 514 protect magnetic sensor element 506 from unwanted variations in the sensed magnetic field. The sensed magnetic field changes will often be those caused by changes arising from fields generated by an object or objects very close to magnetic sensor element 506. Thus, shields 512 and 514, when present, create a magnetic sensor head 500 that may be referred to as a contact bearing magnetic sensor. Without shield 512 and 514, magnetic sensor head 500 may be referred to as a proximity magnetic sensor. A proximity magnetic sensor is also considered an omni-directional magnetic sensor.

The description of the present invention has been presented for purposes of illustration and description, and is not intended to be exhaustive or limited to the invention in the form disclosed. Many modifications and variations will be apparent to those of ordinary skill in the art. For example, the top-forming techniques shown with respect to the AMR head shown in FIG. 3 and FIG. 4 may also be used to form a giant magneto-resistive magnetic sensor head (GMR). Other biasing techniques for AMR sensors include external field techniques, hard layer techniques, soft layer techniques, shunt current techniques, placement in gap techniques, barber pole techniques, paired sensor techniques, canted easy axis techniques, and exchange coupling techniques. In addition, the method of top-forming a magneto-resistive sensor head may be used in a wide variety of sensors that operate by a variety of operating principles. The embodiment was chosen and described in order to best explain the principles of the invention, the practical application, and to enable others of ordinary skill in the art to understand the invention for various embodiments with various modifications as are suited to the particular use contemplated.

What is claimed is:

1. A magneto-resistive sensor head comprising:
   a first lead comprising one of a magnet, a conducting material, or both a magnet and a conducting material;
   a second lead comprising one of a magnet, a conducting material, or both a magnet and a conducting material;
   a magneto-resistive layer disposed between the first lead and the second lead;
   a biasing layer disposed between the first lead and the second lead; and
   a grating disposed in the magneto-resistive layer, wherein a topography of the biasing layer is unaffected by the presence of the grating.

2. The magneto-resistive sensor head of claim 1 wherein:
   a surface of the biasing layer forms a portion of a bottom surface of the magneto-resistive sensor head;
   a surface of the magneto-resistive layer forms a portion of a top surface of the magneto-resistive sensor head; and
   the grating is disposed on the top surface of the magneto-resistive sensor head.

3. The magneto-resistive sensor head of claim 1 wherein the magneto-resistive layer comprises a plurality of sub-layers comprising at least Nickel-Iron and Nickel-Cobalt alloys.

4. The magneto-resistive sensor head of claim 1 wherein the magneto-resistive layer comprises an anisotropic magneto-resistive sensor.

5. The magneto-resistive sensor head of claim 1 wherein the magneto-resistive layer comprises a giant magneto-resistive sensor.

6. The magneto-resistive sensor head of claim 1 wherein the first lead and the second lead are permanent magnets.

7. A method of manufacturing a magneto-resistive sensor head, said method comprising:
   forming a magneto-resistive layer;
   attaching both a first lead and a second lead to a biasing layer and to the magneto-resistive layer;
   forming a grating into the magneto-resistive layer while leaving the biasing layer unperturbed.

8. The method of claim 7 wherein:
   a surface of the biasing layer forms a portion of a bottom surface of the magneto-resistive sensor head;
   a surface of the magneto-resistive layer forms a portion of a top surface of the magneto-resistive sensor head; and
   the step of forming is performed from the top surface of the magneto-resistive sensor head.

9. The method of claim 7 wherein the step of forming a magneto-resistive layer further comprises depositing a plurality of sub-layers comprising at least Nickel-Iron and Nickel-Cobalt alloys, said plurality of sub-layers disposed on a substrate.

10. The method of claim 7 wherein the step of forming a magneto-resistive layer further comprises forming an anisotropic magneto-resistive sensor.

11. The method of claim 7 wherein the step of forming a magneto-resistive layer further comprises forming a giant magneto-resistive sensor.

12. The method of claim 7 wherein the first lead and the second lead are permanent magnets.

13. The method of claim 9 wherein at least one sub-layer of the plurality of sub-layers has a thickness different than all of the other sub-layers.

14. The method of claim 9 wherein a thickness of at least one sub-layer of the plurality of sub-layers remains unchanged after the step of forming is complete.

15. The method of claim 9 wherein the topography of at least one sub-layer of the plurality of sub-layers remains unchanged after the step of forming is complete.

* * * * *